United States Patent
Wang et al.

(10) Patent No.: US 11,139,385 B2
(45) Date of Patent: Oct. 5, 2021

(54) INTERFACE-LESS CONTACTS TO SOURCE/DRAIN REGIONS AND GATE ELECTRODE OVER ACTIVE PORTION OF DEVICE

(71) Applicant: INTERNATIONAL BUSINESS MACHINES CORPORATION, Armonk, NY (US)

(72) Inventors: Junli Wang, Slingerlands, NY (US); Veeraraghavan S. Basker, Schenectady, NY (US); Huiming Bu, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 388 days.

(21) Appl. No.: 15/982,507

(22) Filed: May 17, 2018

(65) Prior Publication Data

US 2019/0355829 A1 Nov. 21, 2019

(51) Int. Cl.
*H01L 29/66* (2006.01)
*H01L 21/02* (2006.01)
*H01L 29/78* (2006.01)
*H01L 29/417* (2006.01)
*H01L 21/768* (2006.01)

(52) U.S. Cl.
CPC ...... *H01L 29/665* (2013.01); *H01L 21/02115* (2013.01); *H01L 21/76897* (2013.01); *H01L 29/41791* (2013.01); *H01L 29/66795* (2013.01); *H01L 29/785* (2013.01)

(58) Field of Classification Search
CPC ........ H01L 21/76897; H01L 29/66545; H01L 29/66795; H01L 29/41791; H01L 21/823437; H01L 29/665; H01L 21/02115; H01L 29/785
See application file for complete search history.

(56) References Cited

U.S. PATENT DOCUMENTS

| | | | | |
|---|---|---|---|---|
| 5,480,814 A | * | 1/1996 | Wuu | H01L 21/76897 257/E21.507 |
| 5,731,241 A | * | 3/1998 | Jang | H01L 21/76232 438/424 |
| 5,817,562 A | * | 10/1998 | Chang | H01L 21/76897 438/305 |

(Continued)

*Primary Examiner* — Allen L Parker
*Assistant Examiner* — Charles N Ausar-El
(74) *Attorney, Agent, or Firm* — Tutunjian & Bitetto, P.C.; Erik Johnson (57) ABSTRACT

A method of providing contact surfaces that includes forming a first mask having an opening to a perimeter of a gate electrode, the first mask having a first protecting portion centrally positioned over the gate electrode within the perimeter, and a second protecting portion of the mask is positioned over metal semiconductor alloy surfaces of source and drain contact surfaces; and recessing exposed portions of metal semiconductor alloy and the gate electrode with an etch. In a following step, the method continues with filling the openings provided by recessing the gate perimeter of the gate electrode, recessing the metal semiconductor alloy adjacent to the gate structure, and the recessed gate electrode adjacent to the metal semiconductor alloy surface of the source and drain contact surfaces with a protecting dielectric material.

15 Claims, 5 Drawing Sheets

(56) References Cited

U.S. PATENT DOCUMENTS

| | | | |
|---|---|---|---|
| 6,521,540 B1* | 2/2003 | Li | H01L 21/76829 |
| | | | 257/E21.507 |
| 9,443,853 B1* | 9/2016 | Cheng | H01L 27/0886 |
| 9,508,825 B1 | 11/2016 | Basker et al. | |
| 9,548,366 B1* | 1/2017 | Ho | H01L 29/665 |
| 9,608,065 B1* | 3/2017 | Bergendahl | H01L 27/0886 |
| 9,647,091 B2* | 5/2017 | Leobandung | H01L 29/0847 |
| 9,728,466 B1* | 8/2017 | Mallela | H01L 21/823828 |
| 9,824,921 B1* | 11/2017 | Labonte | H01L 29/7851 |
| 9,865,730 B1* | 1/2018 | Jagannathan | H01L 29/167 |
| 10,008,416 B2* | 6/2018 | Hsu | H01L 21/28008 |
| 10,084,093 B1* | 9/2018 | Mishra | H01L 29/0847 |
| 10,283,406 B2* | 5/2019 | Basker | H01L 21/76834 |
| 10,312,154 B2* | 6/2019 | Xie | H01L 29/7848 |
| 10,355,009 B1* | 7/2019 | Kai | H01L 27/11526 |
| 10,665,586 B2* | 5/2020 | Xie | H01L 21/76897 |
| 10,867,833 B2* | 12/2020 | Chou | H01L 23/5286 |
| 2014/0252425 A1* | 9/2014 | Cai | H01L 21/28247 |
| | | | 257/288 |
| 2015/0048455 A1* | 2/2015 | Basker | H01L 27/088 |
| | | | 257/368 |
| 2015/0279785 A1* | 10/2015 | Hong | H01L 21/0214 |
| | | | 257/774 |
| 2016/0284817 A1* | 9/2016 | Basker | H01L 29/66545 |
| 2016/0365424 A1* | 12/2016 | Basker | H01L 29/785 |
| 2017/0103917 A1* | 4/2017 | Cai | H01L 29/161 |
| 2017/0162437 A1 | 6/2017 | Rubin et al. | |
| 2017/0162444 A1* | 6/2017 | Ok | H01L 21/823475 |
| 2017/0278752 A1 | 9/2017 | Ryckaert et al. | |
| 2018/0012887 A1 | 1/2018 | Labonte et al. | |
| 2018/0114846 A1* | 4/2018 | Alptekin | H01L 29/665 |
| 2019/0280001 A1* | 9/2019 | Terasawa | H01L 27/11556 |

\* cited by examiner

INTERFACE-LESS CONTACTS TO SOURCE/DRAIN REGIONS AND GATE ELECTRODE OVER ACTIVE PORTION OF DEVICE

BACKGROUND

Technical Field

The present disclosure relates to semiconductor devices, and more particularly to semiconductor devices including contacts to gate structures and source and drain regions.

Description of the Related Art

With the continuing trend towards miniaturization of integrated circuits (ICs), there is a need for transistors to have higher drive currents with increasingly smaller dimensions.

For decades, semiconductor manufacturing was driven by Moore's Law and planar transistor architecture. This provided a predictable, self-sustaining roadmap for transistor cost scaling and well-defined interfaces where each individual process/layer could follow its own technology trajectory independently. However, as the industry scales to provide sub-20 nm nodes and other popular device architectures, such as FinFET and vertical devices are employed, new processes are required, and new approaches for semiconductor manufacturing are being explored and implemented.

In order to achieve acceptable yield and device performance levels with these new architectures, very tight process specifications must be achieved. Thus, better process control and integration schemes are needed now more than ever.

SUMMARY

In one aspect, the present disclosure enables landing of the contact for providing electrical communication to the gate electrode without shorting to the active region of the device or the source and drain regions of the device, e.g., the trench suicide (TS) that is present on the source and drain regions.

In one embodiment, the method includes providing a gate electrode and source and drain contact surfaces that are substantially coplanar. The source and drain contact surface including a metal semiconductor alloy surface. A first mask is formed having an opening to a perimeter of the gate electrode. A first protecting portion of the first mask is centrally positioned over the gate electrode within the perimeter, and a second protecting portion of the mask is positioned over the metal semiconductor alloy surface of the source and drain contact surfaces. An etch process recesses exposed portion of metal semiconductor alloy adjacent to the gate structure, the gate perimeter of the gate electrode, and a portion of the gate electrode adjacent to the metal semiconductor alloy surface as the source and drain contact surfaces. The portion of the gate electrode that is not recessed provides the gate electrode contact surface. The first mask is removed. The openings provided by recessing the gate perimeter of the gate electrode, recessing the metal semiconductor alloy adjacent to the gate structure, and the recessed gate electrode adjacent to the metal semiconductor alloy surface of the source and drain contact surfaces are filled with a protecting dielectric material.

In another aspect, a method is provided for forming a contact to the gate electrodes and source and drain regions of a semiconductor device. In one embodiment, a method for providing contacts for gate electrodes and source and drain regions of a semiconductor device is described that includes forming a first mask having an opening to a perimeter of a gate electrode, the first mask having a first protecting portion centrally positioned over the gate electrode within the perimeter, and a second protecting portion of the mask is positioned over metal semiconductor alloy surfaces of source and drain contact surfaces; and recessing exposed portions of metal semiconductor alloy and the gate electrode. The method may continue with filling the openings provided by recessing the gate perimeter of the gate electrode, recessing the metal semiconductor alloy adjacent to the gate structure, and the recessed gate electrode adjacent to the metal semiconductor alloy surface of the source and drain contact surfaces with a protecting dielectric material having an upper surface that is coplanar with an upper surface of the gate electrode contact surface, and the source and drain contact surfaces. Contacts are then formed to exposed portions of the upper surface of the gate electrode contact surface and the source and drain contact surfaces.

In yet another aspect, a semiconductor device is provided. In one embodiment, the semiconductor device comprises a gate structure including a gate electrode and source and drain regions on opposing sides of the gate structure. The gate electrode has an upper surface including a pedestal, wherein a protective dielectric is present around the perimeter of the pedestal, wherein a base surface of the protective dielectric is present on a non-pedestal surface of the gate electrode, and an upper surface of the protective dielectric is coplanar with an upper surface of the pedestal. Contacts are present to the upper surface of the pedestal and the source and drain regions.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION

Detailed embodiments of the claimed methods, structures and computer products are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. For purposes of the description hereinafter, the terms "upper", "over", "overlying", "lower", "under", "underlying", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In one aspect, embodiments of the present disclosure describe a method of making interface-less contacts to source/drain regions and gate electrodes over active portions of the device. The active region of the device can be referred to as $R_x$, and can include the channel region, source region, and drain region, as well as any portion of the semiconductor material, e.g., silicon, that is not part of the isolation region, e.g., shallow trench isolation (STI) region. Prior to the methods and structures of the present disclosure, to avoid having the gate contact short to the metal semiconductor alloy material present on the source and drain region, or to avoid the gate contact shorting with the contacts to the metal semiconductor alloy, the gate contact was formed landing on a non-active region of the device. The gate contact, e.g., the contact to the gate electrode of the gate structure, may be referred to as CB. The contact to the source/drain, e.g., the contact to the metal semiconductor alloy that is present on the source/drain regions, can be referred to CA. The metal semiconductor alloy that is present on the source/drain regions can be referred to as TS, which is an abbreviation for trench silicide (TS). A silicide is an alloy of a metal, e.g., tungsten (W), and silicon (Si). The methods and structures of the present disclosure enable the gate contact (CB) to land on the active region ($R_x$), and also allows for a reduction in the cell height.

As will be described in further details below, the methods and structures of the present disclosure can eliminate chemical mechanical planarization (CMP) steps, e.g., by removing the self-aligned cap (SAC) cap. Further, by not employing a conventional self-aligned cap (SAC) cap process, the methods and structures described herein can enhance, i.e., help, gate height scaling. Further, one metal level, i.e., the metal level for containing the source and drain regions, e.g., CA contact, is eliminated. This provides a lower cap to the source and drain regions, which results in a lower resistance, because the interface has been removed between the gate and source/drain contacts. In some embodiments, the contacts to the source/drain regions, i.e., contact CA, and the contacts to the gate structure, i.e., CB, are self-aligned through the use of a spacer. This can enable gate contact over active area (CBoA). Further details regarding the method and structures of the present disclosure are now described with reference to FIGS. 1-9C.

Figure 1:
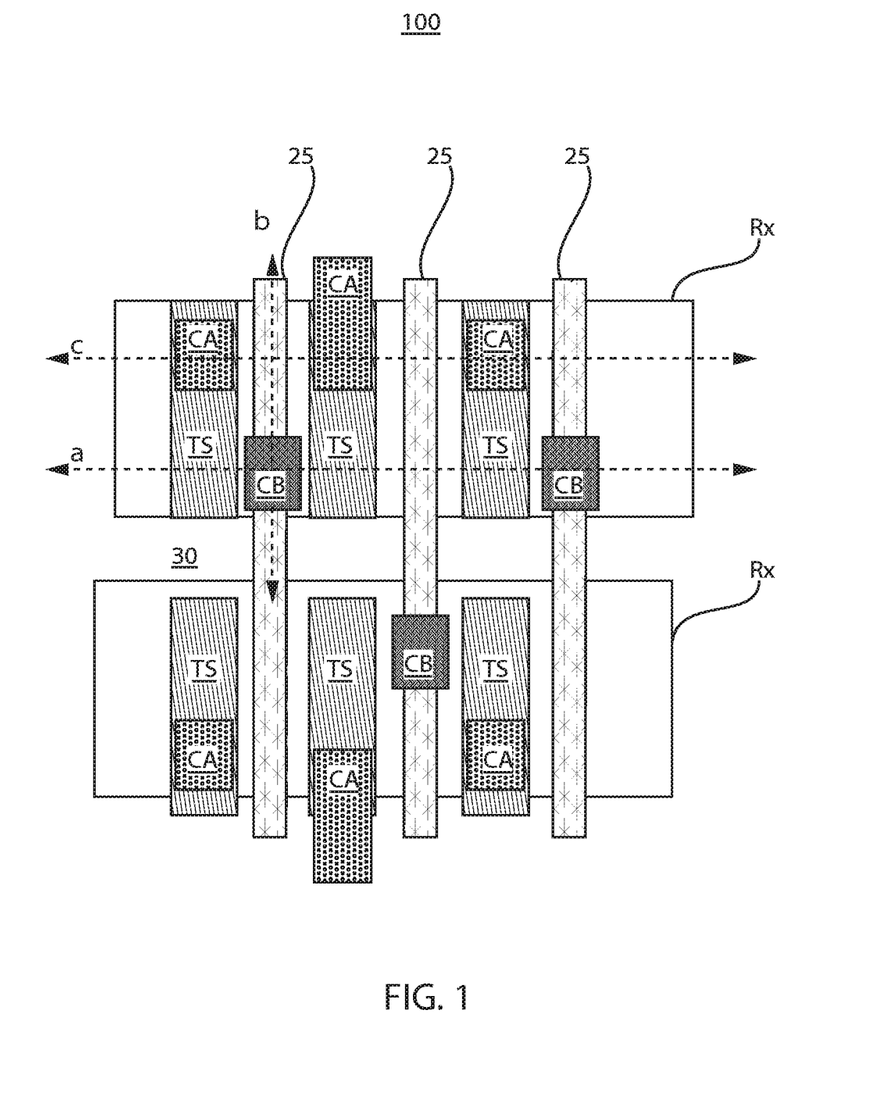
FIG. 1 is a top down view depicting the active region of a semiconductor device, gate contacts, i.e., CB, to the gate structure of the semiconductor device, and contacts, i.e., CA, to the metal semiconductor alloy, i.e., trench silicide (TS) of the source and drain regions of the semiconductor device, in accordance with one embodiment of the present disclosure.

FIG. 1 is a top down view depicting the active region $R_x$ of a semiconductor device 100, gate contacts, i.e., CB, to the gate structure 25 of the semiconductor device 100, and contacts, i.e., CA, to the metal semiconductor alloy, i.e., trench suicide (TS) of the source and drain regions of the semiconductor device 100. In the top down view depicted in FIG. 1, there are three cross-sectional lines identified by a-a, b-b and c-c. A cross-section from section line a-a is through the gate structure 35 and is parallel to the direction of the channel region between the source and drain regions. A cross-section from section line b-b is through the gate structure in a direction perpendicular to the length of the channel region between the source and drain regions. A cross-section taken from section line c-c is through at least one contact CA to the source and drain regions, and is parallel to the direction of the channel region between the source and drain regions. As illustrated in FIG. 1, the gate contacts CB, as well as the source and drain contacts CA are present within the active region $R_x$ of the device 100, and are not present on the isolation region 30 portions of the device 100. The section lines, i.e., a-a, b-b, and c-c, are now employed along with the following description to describe some embodiments for methods of forming the contacts CA, CB that are depicted in FIG. 1.

Figure 2A:
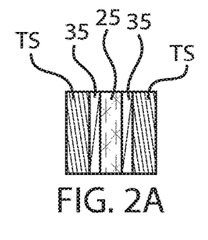
FIG. 2A is a side cross-sectional view of an initial structure along section line A-A of the device, in which in one embodiment the initial structure includes a gate structure provided by a replacement metal gate (RMG) process, and a metal semiconductor alloy present on the source and drain regions of the device.
Figure 2B:
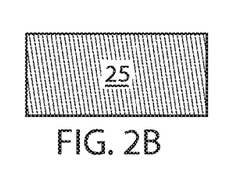
FIG. 2B is a side cross-sectional view of the initial structure that is depicted in FIG. 2A along section line B-B of the device.
Figure 2C:
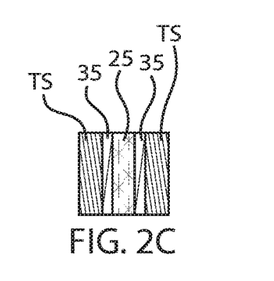
FIG. 2C is a side cross-sectional view of the initial structure that is depicted in FIG. 2A along section line C-C of the device.

FIGS. 2A-2C depict one embodiment of an initial structure of the device. In one embodiment the initial structure includes a gate structure 25 provided by a replacement metal gate (RMG) process, and a metal semiconductor alloy present on the source and drain regions of the device. As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. In the following description, the semiconductor device is a field effect transistor. Complementary metal oxide semiconductor (CMOS) is a type of semiconductor that use both N-type (negative polarity) and P-type (positive polarity) semiconductor circuits. Typically, since only one of the circuit types is on at any given time, CMOS chips require less power than chips using just one type of transistor. A "field effect transistor" is a transistor in which output current, i.e., source-drain current, is controlled by the voltage applied to a gate structure. A field effect transistor typically has three terminals, i.e., a gate structure, source region and drain region. As used herein, the term "source" is a doped region in the semiconductor device, in which majority carriers are flowing into the channel. As used herein, the term "channel" is the region underlying the gate structure and between the source and drain of a semiconductor device that becomes conductive when the semiconductor device is turned on. As used herein, the term "drain" means a doped region in semiconductor device located at the end of the channel, in which carriers are flowing out of the transistor through the drain. A "gate structure", i.e., functional gate structure 25, means a structure used to control output current (i.e., flow of carriers in the channel) of a semiconducting device through electrical or magnetic fields.

The methods and structures of the present disclosure are equally applicable to semiconductor devices 100 that are both planar devices and FinFET devices. A FinFET is a field effect transistor in which at least the channel portion of the field effect transistor is present in a fin structure. As used herein, a "fin structure" refers to a semiconductor material, which can be employed as the body of a semiconductor device, in which the gate structure is positioned around the fin structure such that charge flows down the channel on the two sidewalls of the fin structure and optionally along the top surface of the fin structure. The term "planar" as used to describe a semiconductor device orientation, e.g., planar FET, denotes that the direction of charge carriers from the source region to the drain region of the semiconductor device is along a plane that is parallel to the upper surface of the substrate, wherein a gate structure is present on the upper surface of the substrate. In a planar semiconductor device, the gate structure does not wrap around the sidewalls of the channel region as in a fin structure.

The gate structures 25 of the present disclosure are replacement gate structure, e.g., replacement metal gate (RMG) structures. This means that a sacrificial gate structure was formed initially during the process flow for processing of the source and drain regions. The sacrificial gate structure is a placeholder, having the orientation and size of the subsequently formed functional gate structure. Following processing of the source and drain regions, the sacrificial gate structure is removed, and a functional gate structure is formed in its place, e.g., replacement metal gate (RMG) structure. In this manner, the functional gate structure is not subjected to the processing that is applied to the source and drain regions, such as high temperature annealing, e.g., activation annealing. This is also referred to as gate last processing.

More specifically, in one embodiment, a sacrificial gate structure (not shown) is formed on the channel region portion of the semiconductor device, and a spacer 35 is formed on the sidewall of the sacrificial gate structure. In a following process step, source and drain regions may be formed on opposing sides of the sacrificial gate structure. The source and drain regions are not depicted in the supplied figures, but are present underlying the metal semiconductor alloy contact surfaces, i.e., trench silicide (TS). In some embodiments, the source and drain regions may be formed using epitaxial deposition process, in which the dopant for the source and drain regions is introduced by in situ doping. In other embodiments, the source and drain regions may be formed using ion implantation. Following the formation of the source and drain regions, an interlevel dielectric layer may then be deposited and planarized to expose an upper surface of the sacrificial gate structure. The replacement metal gate process may continue with removing the sacrificial gate structure using an etch process that can be selective to the interlevel dielectric, as well as the channel region of the semiconductor device, and the sidewalls spacers 35. Removing the sacrificial gate structure forms a gate opening to the channel region of the semiconductor device.

In a following process step, a functional gate structure 25 in the space once occupied by the replacement gate structure, i.e., the gate opening. The functional gate structure 25 includes at least one gate dielectric (not shown), and at least one gate electrode. The gate dielectric may be deposited using chemical vapor deposition, e.g., plasma enhanced chemical vapor deposition (PECVD) or metal organic chemical vapor deposition (MOCVD), or the gate dielectric may be deposited using atomic layer deposition (ALD). In one embodiment, the at least one gate dielectric includes, but is not limited to, an oxide, nitride, oxynitride and/or silicates including metal silicates, aluminates, titanates and nitrides. In one example, when the at least one gate dielectric is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of the at least one gate dielectric layer may vary, but typically, the at least one gate dielectric layer has a thickness from 1 nm to 10 nm. In another embodiment, the at least one gate dielectric layer has a thickness from 1 nm to 3 nm. In some embodiments, the gate dielectric may be composed of a high-k gate dielectric having a dielectric constant greater than silicon oxide at room temperature, e.g., 20° C. to 25° C., and atmospheric pressure, e.g., 1 atm.

The functional gate structure 25 may further include a work function adjusting layer. The work function adjusting layer may be present on the gate dielectric. The work function adjusting layer may be a nitride, including, but not limited to, titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. The work function adjusting layer may be deposited using chemical vapor deposition or physical vapor deposition. Examples of PVD suitable for forming the work function adjusting layer include plating, electroless deposition, electroplating and combinations thereof.

The functional gate structure 25 may also include a gate electrode. The gate electrode may be present atop the work function adjusting layer (when present) or the gate electrode may be present on the gate dielectric (when the work function adjusting layer is not present). The gate electrode may be composed of an electrically conductive material. The electrically conductive material of the gate electrode may comprise polysilicon, SiGe, a silicide, a metal or a metal-silicon-nitride such as Ta—Si—N. Examples of metals that can be used as the gate electrode include, but are not limited to, Al, W, Cu, and Ti or other like conductive metals. The layer of conductive material for the gate electrode may be doped or undoped. If doped, an in-situ doping deposition process may be employed. Alternatively, a doped conductive material can be formed by deposition, ion implantation and annealing. The gate electrode may be formed using a PVD deposition process, such as sputtering, plating, electroplating, electroless plating and combinations thereof. The gate electrode may also be formed using chemical vapor deposition or atomic layer deposition.

The gate electrode may be deposited to fill an entirety of the gate structure opening. In some embodiments, a planarization process, e.g., chemical mechanical planarization (CMP) may be applied to the deposited material for the gate electrode to provide that the upper surface of the gate electrode is coplanar with the upper surface of the interlevel dielectric layer.

The functional gate structure 25 does not include a dielectric cap, such as a self aligned cap (SAC), present on the upper surface of the gate structure 25. In the embodiments of the present disclosure, the upper surface of the functional gate structure 25 is a conductive portion of the gate structure, such as a gate electrode.

Still referring to FIGS. 2A-2C, openings can be formed through the interlevel dielectric to expose upper surface of the source and drain regions, which may include an epitaxial semiconductor material, such as silicon. In a following process, the metal semiconductor alloy is formed on the upper surface of the source and drain regions. In some embodiments, in which the upper surface of the source and drain regions is composed of silicon, the metal semiconductor alloy may be a silicide. Silicide formation typically requires depositing a refractory metal such as Ni or Ti onto the surface of a Si-containing material or wafer. Following deposition, the structure is then subjected to an annealing step using conventional processes such as, but not limited to, rapid thermal annealing. During thermal annealing, the deposited metal reacts with Si forming a metal silicide.

Figure 3A:
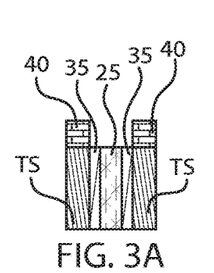
FIG. 3A is a side cross-sectional view of a lithography step for providing a block mask of a photoresist material on the structure depicted in FIG. 2A, in which the block mask provides form forming both the contacts to the gate structure, i.e., CB, and the contacts to the metal semiconductor alloy, e.g., trench silicide (TS) that is present on the source and drain regions.
Figure 3B:
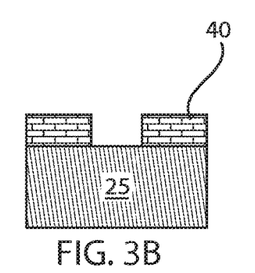
FIG. 3B is a side cross-sectional view of the structure that is depicted in FIG. 3A along section line B-B of the device.
Figure 3C:
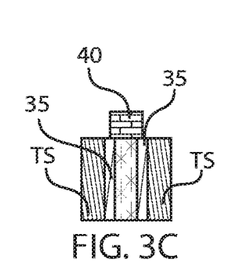
FIG. 3C is a side cross-sectional view of the structure that is depicted in FIG. 3A along section line C-C of the device.

FIGS. 3A-3C depict one embodiment of a lithography step for providing a block mask 40 of a photoresist material on the structure depicted in FIG. 2A, in which the block mask 40 provides for forming both the contacts to the gate structure, i.e., CB, and the contacts to the metal semiconductor alloy, e.g., trench silicide (TS) that is present on the source and drain regions, i.e., CA. The block mask 40 may comprise conventional soft and/or hardmask materials and can be formed using deposition, photolithography and etching. In a preferred embodiment, the block mask 45 comprises a photoresist. A photoresist block mask 40 can be produced by applying a photoresist layer to the surface to be patterned, exposing the photoresist layer to a pattern of radiation, and then developing the pattern into the photoresist layer utilizing resist developer.

Alternatively, the block mask 40 can be a hardmask material. Hardmask materials include dielectric systems that may be deposited by chemical vapor deposition (CVD) and related methods. Typically, the hardmask composition includes silicon oxides, silicon carbides, silicon nitrides, silicon carbonitrides, etc. Spin-on dielectrics may also be utilized as a hardmask material including, but not limited to: silsequioxanes, siloxanes, and boron phosphate silicate glass (BPSG). A block mask 40 comprising a hardmask material may be formed by blanket depositing a layer of hardmask material; providing a patterned photoresist atop the layer of hardmask material; and then etching the layer of hardmask material to provide a block mask 40.

In some embodiments, the block mask 40 that is formed during this stage of the process flow protects the portion of the device in which the protective dielectric layer is ultimately positioned. The protective dielectric layer protects the device from shorting between the contact, i.e., CB, to the gate structure 25, and the contact, i.e., CA, to the source and drain regions, i.e., to the metal semiconductor alloy material that is present on the source and drain regions, e.g., trench silicide (TS).

Figure 4A:
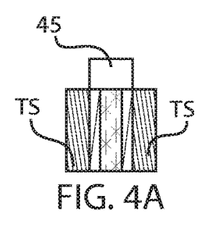
FIG. 4A is a side cross-sectional view depicting one embodiment of forming a first hard mask on the structure depicted in FIG. 3A by depositing a dielectric material, such as an oxide and/or nitride, in the openings in the mask that followed by a removing the mask, in accordance with one embodiment of the present disclosure.
Figure 4B:
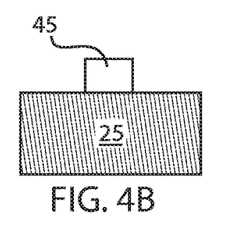
FIG. 4B is a side cross-sectional view of the structure that is depicted in FIG. 4A along section line B-B of the device.
Figure 4C:
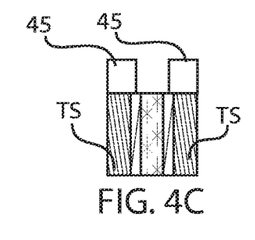
FIG. 4C is a side cross-sectional view of the structure that is depicted in FIG. 4A along section line C-C of the device.

FIGS. 4A-4C depict one embodiment of forming a first hard mask 45 on the structure depicted in FIG. 3A by depositing a dielectric material, such as an oxide and/or nitride, in the openings in the mask that followed by a removing the block mask 40. The first hard mask 45 is deposited filling the openings in the first block mask 40 with a dielectric material. For example, the first hard mask 45 may be deposited using chemical vapor deposition (CVD). Chemical vapor deposition (CVD) is a deposition process in which a deposited species is formed as a result of chemical reaction between gaseous reactants at greater than room temperature (25° C. to 900° C.); wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (PECVD), Metal-Organic CVD (MOCVD) and combinations thereof may also be employed. It is noted that chemical vapor deposition is not the only method that can be employed to deposit the first hard mask 45. For example, the first hard mask 45 may be deposited using atomic layer deposition (ALD).

Following deposition, the material for the first hard mask 45 may be planarized to provide that the upper surface of the first hard mask 45 is coplanar with the upper surface of the first block mask 40. The planarization process may be a chemical mechanical planarization (CMP) process. Following the CMP process, the first block mask 40 may be removed. The first block mask 40 may be removed using an etch process that is selective to the first hard mask 45.

Referring to FIGS. 4A and 4B, a portion of the first hard mask 45 may be present atop the gate structure 25. For example, referring to FIG. 4A, along section line a-a, the first hard mask 45 is present atop the gate structure 25 extending to cover the gate sidewall spacers 35. Referring to FIG. 4B, along section line b-b, the first hard mask 45 is present on a central portion of the gate structure 25, in which the perimeter portions of the gate structure 25 are exposed by the first hard mask 45. The central portion of the gate structure 25 that is protected by the first hard mask 45 is the portion of the gate structure 25 that is contacted by the gate contact CB, while the perimeter portion of the gate structure that is exposed by the first hard mask 45 is the portion of the gate structure 25 that the protective dielectric material is present on.

Referring to FIG. 4C, along section line c-c, the portion of the gate structure 25 that is adjacent to the source and drain regions is exposed by the first hard mask 45. The metal semiconductor alloy, e.g., trench silicide (TS), that is present on the source and drain regions of the device is protected by the first hard mask 45.

Figure 5A:
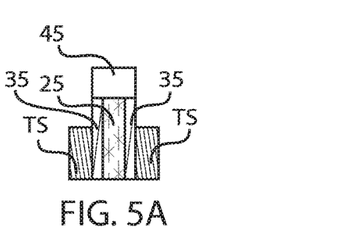
FIG. 5A is a side cross-sectional view of the structure depicted in FIG. 4A depicting an etch process to recess the metal semiconductor alloy, e.g., trench silicide, that is present on the contacts to the source and drain regions and a portion of the gate electrode of the device, which is followed by removing the first hard mask, in accordance with one embodiment of the present disclosure.
Figure 5B:
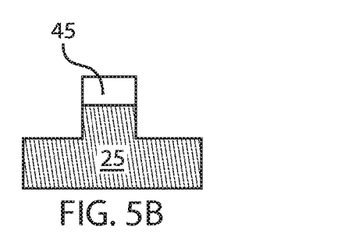
FIG. 5B is a side cross-sectional view of the structure that is depicted in FIG. 5A along section line B-B of the device.
Figure 5C:
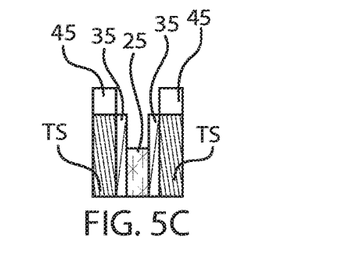
FIG. 5C is a side cross-sectional view of the structure that is depicted in FIG. 5A along section line C-C of the device.

FIGS. 5A-5C depict an etch process to recess the metal semiconductor alloy, e.g., trench silicide (TS), that is present on the contacts to the source and drain regions, and a portion of the gate electrode of the gate structure 25 of the device, which is followed by removing the first hard mask 45. The etch process for recessing the metal semiconductor alloy, e.g., trench silicide (TS), and for recessing the gate electrode of the gate structure 25 may be an anisotropic etch, i.e., directional etch. As used herein, an "anisotropic etch process" denotes a material removal process in which the etch rate in the direction normal to the surface to be etched is greater than in the direction parallel to the surface to be etched. The anisotropic etch may include reactive-ion etching (RIE). Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

Still referring to FIGS. 5A-5C, in some embodiments, the etch process for recessing the exposed portions of the metal semiconductor alloy, e.g., trench silicide (TS), and for recessing the exposed portions of the gate electrode for the gate structure 25, may be an etch process that is selective to at least the first hard mask 45 and the gate sidewall spacer 30. As used herein, the term "selective" in reference to a material removal process denotes that the rate of material removal for a first material is greater than the rate of removal for at least another material of the structure to which the material removal process is being applied.

FIG. 5B illustrates recessing the gate electrode portion of the gate structure 25. FIG. 5B illustrates recessing the exposed perimeter portions of the gate electrode for the gate structure 25, wherein a centrally positioned pedestal portion of the gate structure 25 is protected by the first hard mask 45, and is therefore not recessed. The pedestal portion of the gate structure 25 that is not recessed provides the contact surface of the gate structure 25. The contact surface of the gate structure 25 is the portion of the gate structure that is contacted by the gate structure contact, i.e., CB. FIG. 5B is a cross section along section line b-b.

FIG. 5A illustrates the portion of the metal semiconductor alloy, i.e., trench silicide (TS), of the device that is recessed in the portion of the active region $R_x$ which is adjacent to the gate structure 25 of the device. FIG. 5A is cross sectional along section line a-a. The entirety of the gate structure 25 is protected by the first hard mask 45 along section line a-a.

FIG. 5C illustrates recessing the portion of the gate electrode of the gate structure 25 in the portion of the active region $R_x$ of the device, in which the contact, i.e., CA, to the source and drain regions contacts the metal semiconductor alloy, i.e., trench silicide (TS), of the source and drain regions. The metal semiconductor alloy, i.e., trench silicide (TS), of the source and drain regions is protected from being recessed by the first hard mask 45 in the portion of the active region $R_x$ of the device, in which the contact, i.e., CA, to the source and drain regions contacts the metal semiconductor alloy, i.e., trench silicide (TS), of the source and drain regions.

Figure 6A:
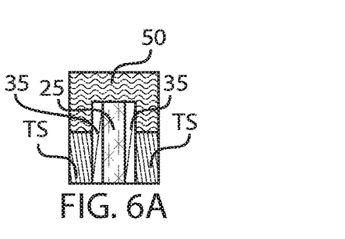
FIG. 6A is a side cross-sectional view of depositing a dielectric material atop the recessed surfaces of the metal semiconductor alloy on the source and drain regions of the device, and the recessed surfaces of the gate electrode of the device, to provide a protective dielectric material on the structure depicted in FIG. 5A.
Figure 6B:
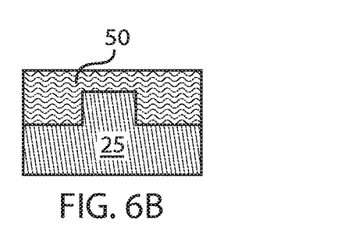
FIG. 6B is a side cross-sectional view of the structure that is depicted in FIG. 6A along section line B-B of the device.
Figure 6C:
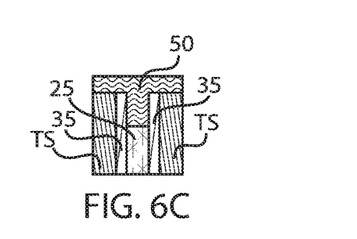
FIG. 6C is a side cross-sectional view of the structure that is depicted in FIG. 6A along section line C-C of the device.

FIGS. 6A-6C depict depositing a dielectric material, i.e., protective dielectric material 50, atop the recessed surfaces of the metal semiconductor alloy, e.g., trench silicide (TS), on the source and drain regions of the device, and the recessed surfaces of the gate electrode of the gate structure 25 of the device. In one embodiment, the openings provided by recessing the gate perimeter of the gate electrode, recessing the metal semiconductor alloy adjacent to the gate structure, and the recessed gate electrode adjacent to the metal semiconductor alloy surface of the source and drain contact surfaces are filled with the protecting dielectric material 50.

The protective dielectric material 50 may be composed of silicon boron carbon nitride (SiBCN). It is noted that silicon boron carbon nitride (SiBCN) is only one example of a dielectric composition that is suitable for use with the methods and structures that are described herein. In some embodiments, the protective dielectric material 50 may be composed of another nitride containing dielectric, such as silicon nitride. In other embodiments, the protective dielectric material 50 may be composed of an oxide containing dielectric, such as silicon oxide. In yet other embodiment, the composition of the protective dielectric material may be silicon oxynitride.

The protective dielectric material 50 may be deposited using a chemical vapor deposition process. Variations of CVD processes suitable for forming the protective dielectric material 50 can include, but are not limited to, Atmospheric Pressure CVD (APCVD), Low Pressure CVD (LPCVD) and Plasma Enhanced CVD (PECVD), Metal-Organic CVD (MOCVD) and combinations thereof may also be employed. In other examples, the protective dielectric material 50 may be formed using atomic layer deposition (ALD), physical vapor deposition (PVD), deposition from solution, spin on deposition, as well as other forms of deposition used in semiconductor device processing.

The protective dielectric material 50 functions to protect the device from shorting between the contacts to the source and drain regions, i.e., CA, and the contacts to the gate structure, i.e., CB.

Figure 7A:
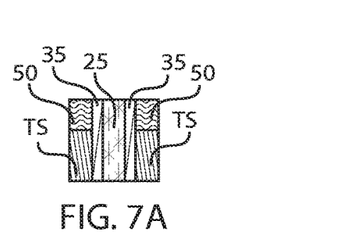
FIG. 7A is a side cross-sectional view of a planarization process, such as chemical mechanical planarization (CMP), that is applied to the structure depicted in FIG. 6A, in accordance with one embodiment of the present disclosure.
Figure 7B:
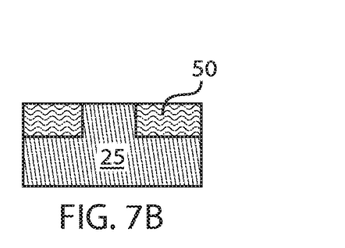
FIG. 7B is a side cross-sectional view of the structure that is depicted in FIG. 7A along section line B-B of the device.
Figure 7C:
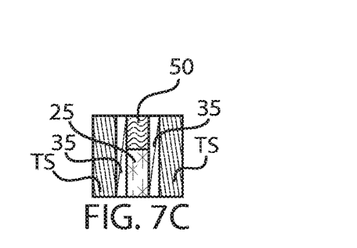
FIG. 7C is a side cross-sectional view of the structure that is depicted in FIG. 7A along section line C-C of the device.

FIGS. 7A-7C depict one embodiment of a planarization process, such as chemical mechanical planarization (CMP), that is applied to the structure depicted in FIG. 6A. The planarization process is applied until the upper surface of the protective dielectric material 50 is coplanar with the upper surface of the contact surface of the gate structure 25, as well as the upper surface of the contact surface of the metal semiconductor alloy, e.g., trench silicide (TS), of the source and drain regions of the semiconductor device.

Referring to FIGS. 7A-7C, the gate electrode of the gate structure 25 has an upper surface including a pedestal, wherein a protective dielectric 50 is present around the perimeter of the pedestal, wherein a base surface of the protective dielectric 50 is present on a non-pedestal surface of the gate electrode, and an upper surface of the protective dielectric 50 is coplanar with an upper surface of the pedestal.

Figure 8A:
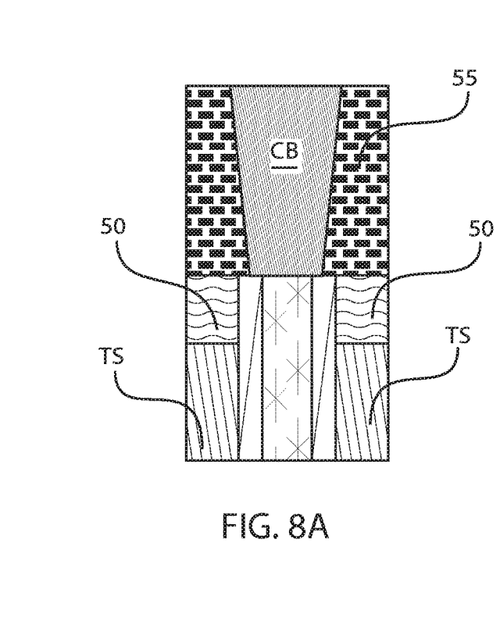
FIG. 8A is a side cross-sectional view depicting one embodiment of forming contacts to the gate structure and the source and drain regions of the semiconductor device that is depicted in FIG. 7A.
Figure 8B:
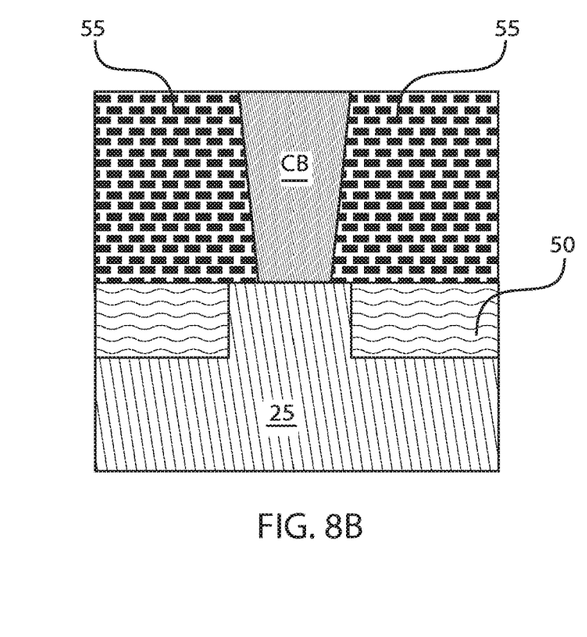
FIG. 8B is a side cross-sectional view of the structure that is depicted in FIG. 8A along section line B-B of the device.
Figure 8C:
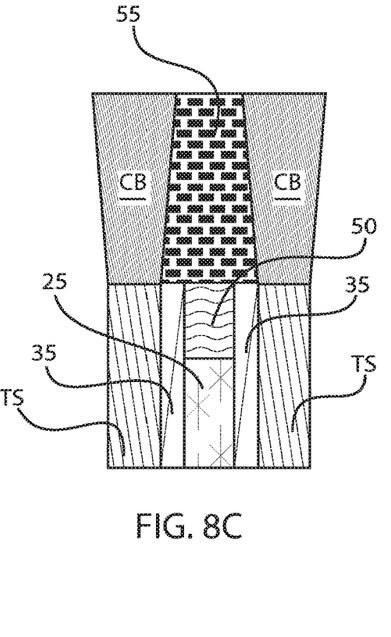
FIG. 8C is a side cross-sectional view of the structure that is depicted in FIG. 8A along section line C-C of the device.

FIGS. 8A-8C illustrate one embodiment of forming contacts CB, CA to the gate structure 25, and the source and drain regions of the semiconductor device 100 that is depicted in FIGS. 7A-7C. Forming the contacts CB, CA may include depositing an interlevel dielectric layer 55, forming via openings in the interlevel dielectric 55 to the gate electrode of the gate structure 25 and the metal semiconductor alloy, e.g., trench silicide (TS), of the source and drain regions, and filling the via openings to provide the contacts CB, CA. The contact CB, CA s are then formed to exposed portions of the upper surface of the gate electrode contact surface and the source and drain contact surfaces.

The interlevel dielectric layer 55 may have a composition that can be selected from the group consisting of silicon containing materials such as $SiO_2$, $Si_3N_4$, $SiOXN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, $\alpha$-C:H). Additional choices for the interlevel dielectric layer 55 include any of the aforementioned materials in porous form, or in a form that changes during processing to or from being porous and/or permeable to being non-porous and/or non-permeable.

Via openings may be formed through the interlevel dielectric layer 55 using photolithography and etch processes. Following via formation, the contacts CA, CB are formed by depositing a conductive metal into the via holes using deposition methods, such as CVD, sputtering or plating. The conductive metal may include, but is not limited to: tungsten, copper, aluminum, silver, gold and alloys thereof.

The embodiments of the present disclosure describe a method of making interface-less contacts to source/drain regions and gate electrodes over active portions Rx of the device. In some embodiments, the protective dielectric material 50 avoids having the gate contact short to the metal semiconductor alloy material, e.g., trench silicide (TS), that is present on the source and drain region, or to avoid the gate contact CB shorting with the contacts CA to the metal semiconductor alloy, e.g., trench silicide (TS). The methods and structures of the present disclosure enable the gate contact (CB) to land on the active region ($R_x$), and also allows for a reduction in the cell height.

The methods and structures of the present disclosure eliminate chemical mechanical planarization (CMP) steps, e.g., by removing the self-aligned cap (SAC) cap. Further, by not employing a conventional self-aligned cap (SAC) cap process, the methods and structures described herein enhance gate height scaling. Further, one metal level, i.e., the metal level for containing the source and drain regions, e.g., CA contact, is eliminated. This provides a lower cap to the source and drain regions, which results in a lower resistance, because the interface has been removed between the gate and source/drain contacts. In some embodiments, the contacts to the source/drain regions, i.e., contact CA, and the contacts to the gate structure, i.e., CB, are self-aligned through the use of a spacer. This can enable gate contact (CB) over active area (CBoA).

In yet another aspect, a semiconductor device is provided. In one embodiment, the semiconductor device comprises a gate structure including a gate electrode and source and drain regions on opposing sides of the gate structure. The gate electrode has an upper surface including a pedestal, wherein a protective dielectric is present around the perimeter of the pedestal, wherein a base surface of the protective dielectric is present on a non-pedestal surface of the gate electrode, and an upper surface of the protective dielectric is coplanar with an upper surface of the pedestal. Contacts are present to the upper surface of the pedestal and the source and drain regions.

Figure 9A:
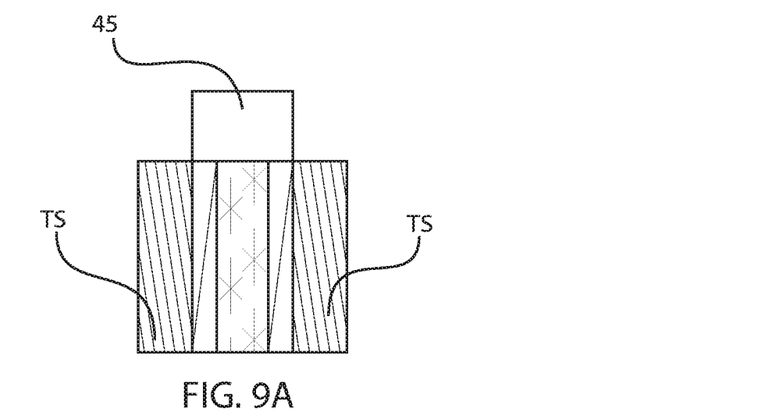
FIGS. 9A-9C are side cross-sectional view depicting one embodiment of an isotropic etching process step to address bad variability control.
Figure 9B:
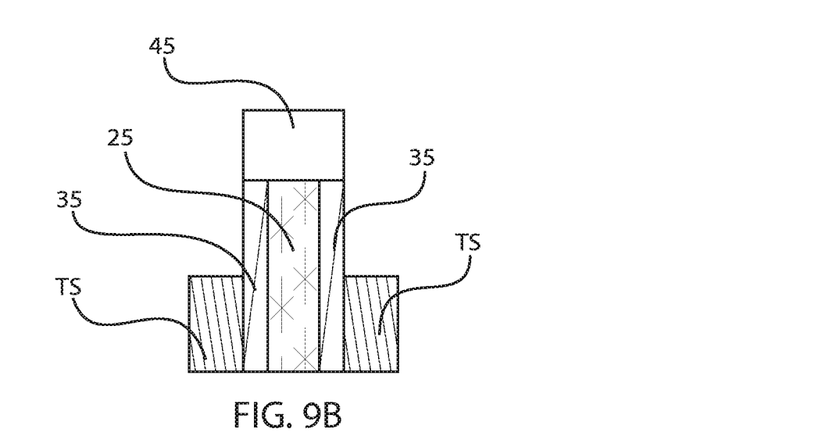
Figure 9C:
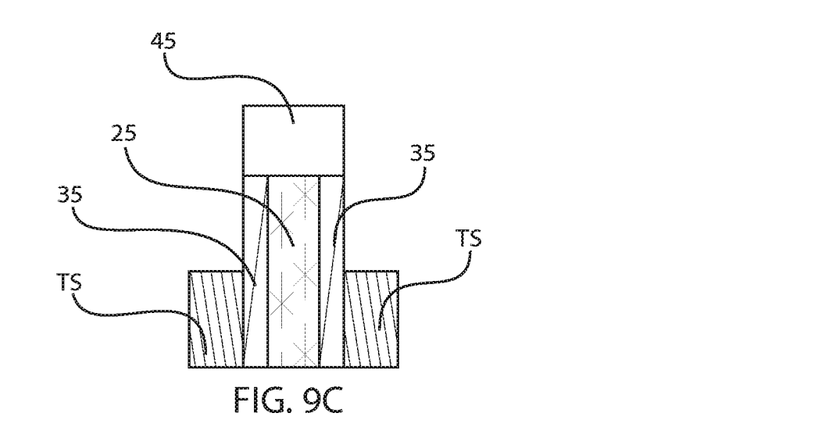

FIGS. 9A-9C are side cross-sectional view depicting one embodiment of an isotropic etching process step to address bad variability control. Additional isotropic etching process step to address the worst case due to bad variability control. In some embodiments, if CB edge placement offset happened, there could be either TS residual, as depicted in FIG. 9B. FIG. 9C illustrates the application of an isotropic etch can remove the TS residual.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of an interface-less contacts to source/drain regions and gate electrode over the active portion of the device herein, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of providing contact surfaces for gate electrodes and source and drain regions of a semiconductor device comprising:
   forming a hard mask having an opening to a perimeter of a gate electrode of a gate structure, the hard mask having a first protecting portion centrally positioned over the gate electrode within the perimeter, and a second protecting portion of the mask is positioned over metal semiconductor alloy surfaces of source and drain contact surfaces;
   recessing exposed portions of metal semiconductor alloy adjacent to the gate structure, the gate perimeter of the gate electrode, and a portion of the gate electrode adjacent to the metal semiconductor alloy surface as the source and drain contact surfaces with an etch, wherein the portion of the gate electrode protected by the first protecting portion of the hard mask provides the gate electrode contact surface; and
   filling the openings provided by recessing the gate perimeter of the gate electrode, recessing the metal semiconductor alloy adjacent to the gate structure, and the recessed gate electrode adjacent to the metal semiconductor alloy surface of the source and drain contact surfaces with a protecting dielectric material comprising silicon, boron, carbon and nitrogen.

2. The method of claim 1, wherein the protecting dielectric material has an upper surface that is coplanar with an upper surface of the gate electrode contact surface, and the source and drain contact surfaces.

3. The method of claim 2, wherein the protecting dielectric material comprises silicon boron carbon nitride (SiBCN).

4. The method of claim 1, wherein forming the hard mask comprises:
   forming a photoresist mask including openings for the hard mask;
   depositing a dielectric material for the hard mask in the openings for the hard mask that are present in the photoresist mask;
   planarizing the dielectric material; and
   removing the photoresist mask.

5. The method of claim 1, wherein said recessing comprises an anisotropic etch process.

6. The method of claim 1, further comprising planarizing the protective dielectric material.

7. A method for forming a contact to the gate electrodes and source and drain regions of a semiconductor device comprising:
   forming a hard mask having an opening to a perimeter of a gate electrode, the hard mask having a first protecting portion centrally positioned over the gate electrode within the perimeter, and a second protecting portion of the hard mask is positioned over metal semiconductor alloy surfaces of source and drain contact surfaces;
   recessing exposed portions of metal semiconductor alloy and the gate electrode;
   filling the openings provided by recessing the gate perimeter of the gate electrode, recessing the metal semiconductor alloy adjacent to the gate structure, and the recessed gate electrode adjacent to the metal semiconductor alloy surface of the source and drain contact surfaces with a protecting dielectric material comprising silicon, boron, carbon and nitrogen; and
   forming contacts to exposed portions of the upper surface of the gate electrode contact surface and the source and drain contact surfaces, wherein etch processes for forming the contacts are selective to the protecting dielectric material.

8. The method of claim 7, wherein the protecting dielectric material has an upper surface that is coplanar with an upper surface of the gate electrode contact surface, and the source and drain contact surfaces.

9. The method of claim 8, wherein the protecting dielectric material comprises silicon boron carbon nitride (SiBCN).

10. The method of claim 7, wherein forming the hard mask comprises:
    forming a photoresist mask including openings for the hard mask;
    depositing a dielectric material for the hard mask in the openings for the hard mask that are present in the photoresist mask;
    planarizing the dielectric material; and
    removing the photoresist mask.

11. The method of claim 7, wherein said recessing comprises an anisotropic etch process.

12. The method of claim 7, further comprising planarizing the protective dielectric material.

13. The method of claim 7, wherein forming said contacts comprises:
    depositing an interlevel dielectric layer;
    forming via openings to the gate electrode and the metal semiconductor alloy surfaces of source and drain contact surfaces; and
    filling the via openings with electrically conductive material.

14. The method of claim 13, wherein the protective dielectric material obstructs the contacts to the gate electrode from shorting to the contacts to the metal semiconductor alloy surfaces of the source and drain contact surfaces.

15. The method of claim 13, wherein the contacts are present over an active region of the semiconductor device.

* * * * *